US010165707B1

(12) United States Patent
Christiansen et al.

(10) Patent No.: US 10,165,707 B1
(45) Date of Patent: Dec. 25, 2018

(54) DEVICE AND METHOD FOR PROVIDING IMMERSION COOLING IN A COMPACT-FORMAT CIRCUIT CARD ENVIRONMENT

(71) Applicants: Martin Brokner Christiansen, Laurel, MD (US); Bruce Ryan Isler, Cantonsville, MD (US); Jonathan Francis Van Dyke, Baltimore, MD (US); Robert J. Voigt, Arnold, MD (US); Benjamin Chaoning Liu, Silver Spring, MD (US)

(72) Inventors: Martin Brokner Christiansen, Laurel, MD (US); Bruce Ryan Isler, Cantonsville, MD (US); Jonathan Francis Van Dyke, Baltimore, MD (US); Robert J. Voigt, Arnold, MD (US); Benjamin Chaoning Liu, Silver Spring, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/965,001

(22) Filed: Apr. 27, 2018

(51) Int. Cl.
G06F 1/16 (2006.01)
H05K 5/00 (2006.01)
H05K 7/00 (2006.01)
H05K 7/20 (2006.01)

(52) U.S. Cl.
CPC ..... *H05K 7/20236* (2013.01); *H05K 7/20263* (2013.01); *H05K 7/20272* (2013.01); *H05K 7/20872* (2013.01)

(58) Field of Classification Search
CPC .......... H05K 7/20236; H05K 7/20263; H05K 7/20272; H05K 7/20872; H05K 7/20218; H05K 7/20245; H05K 7/20254; H05K 7/20981; H05K 7/20927; H05K 7/20763;
(Continued)

(56) References Cited

U.S. PATENT DOCUMENTS 7,916,483 B2 *  3/2011  Campbell .......... H05K 7/20772
                                                   165/80.4
9,622,379 B1 *  4/2017  Campbell ............ H05K 7/2039
(Continued)

*Primary Examiner* — Anthony M Haughton
(74) *Attorney, Agent, or Firm* — Tarolli, Sundheim, Covell & Tummino LLP

(57) ABSTRACT

An apparatus for providing immersion cooling in a compact-format circuit card environment comprises a plurality of circuit cards. A plurality of thermal energy transfer devices is provided, each thermal energy transfer device at least partially inducing a respective one of first and second operating temperatures to a corresponding circuit card subassembly. At least one first temperature cooling manifold is in selective fluid communication with at least one first operating temperature thermal energy transfer device. At least one second temperature cooling manifold is in selective fluid communication with at least one second operating temperature thermal energy transfer device. A plurality of manifold interfaces is provided, each manifold interface being in fluid communication with a corresponding thermal energy transfer device. A housing includes first and second operating fluid inlets in fluid communication with first and second operating fluid outlets, respectively.

20 Claims, 16 Drawing Sheets

(58) Field of Classification Search
CPC ....... H05K 7/20627; G06F 1/20; G06F 1/203; G06F 1/206
USPC ........................................ 361/699, 689, 698
See application file for complete search history.

(56) References Cited

U.S. PATENT DOCUMENTS

| | | | |
|---|---|---|---|
| 2010/0103618 A1* | 4/2010 | Campbell | H05K 7/20236 361/699 |
| 2011/0132579 A1* | 6/2011 | Best | H05K 7/20763 165/104.31 |
| 2011/0134604 A1* | 6/2011 | Attlesey | G06F 1/20 361/679.47 |
| 2013/0013940 A1* | 1/2013 | Farrar | G06F 1/266 713/310 |
| 2013/0021752 A1* | 1/2013 | Campbell | H05K 13/00 361/700 |
| 2014/0211412 A1* | 7/2014 | Best | H05K 7/20772 361/679.47 |
| 2015/0373882 A1* | 12/2015 | Smith | H05K 7/20818 361/679.46 |
| 2017/0311484 A1* | 10/2017 | Ozyalcin | H05K 7/20236 |

\* cited by examiner

US 10,165,707 B1

DEVICE AND METHOD FOR PROVIDING IMMERSION COOLING IN A COMPACT-FORMAT CIRCUIT CARD ENVIRONMENT

TECHNICAL FIELD

This disclosure relates to a temperature control method, system, and apparatus and, more particularly, to an apparatus, system, and method for providing immersion cooling in a compact-format circuit card environment.

BACKGROUND

A circuit card is the current state of the art for building assemblies of electronic devices including a plurality of integrated circuits ("chips"). These assemblies can be separated into multiple types: organic multilayer laminated printed wire board (PWB), low temperature co-fired ceramic (LTCC), and high temperature co-fired ceramic (HTCC). Using each of these technologies, circuit card assemblies have been fabricated.

In a superconducting supercomputer, many of the operating processing integrated circuits ("chips") are cooled to about 4K, but certain of the memory chips instead have a much warmer operating temperature of about 77K. Providing cooling at 4K is a costly activity, so every effort is made in superconducting supercomputer design to reduce the thermal parasitic load. This includes placing the assembly in vacuum (no convection), use of coatings and multilayer insulation to reduce radiation, and limiting the conductive thermal load between the "hot side" and "cool side" of the entire assembly.

For large scale applications, the state of the art currently solves the problem of achieving the desired operating temperatures for a superconducting supercomputer while avoiding thermal parasitic load by using dewars for each of the cryogenic temperatures. A 4K dewar is maintained with liquid helium and a 77K dewar uses liquid nitrogen. Signals between the two temperature sides are completed by cabling. This solution requires cables that are long from a digital perspective, which results in significant latency between the 4K and 77K regions and would require more parts in the 4K stage, such as, but not limited to, amplifiers to compensate for the loss in the longer signal path. These additional parts consume significant power and make certain designs of superconducting supercomputers infeasible.

In small scale applications, a cryocooler can be used for both temperatures. The intermediate stage of the cryocooler provides a 77K platform while the final stage of the cryocooler provides a 4K stage. Connections between the two zones are completed by cabling. While this brings the two temperatures sides closer together, this approach is not scalable to large applications.

Additionally, neither of the above strategies is particularly suited to a compact-format use environment, such as providing computing resources on an aircraft, due to the significant space and equipment needed.

SUMMARY

In an aspect, an apparatus for providing immersion cooling in a compact-format circuit card environment is provided. The apparatus comprises a plurality of circuit cards. Each circuit card includes first and second longitudinally spaced circuit card subassemblies, connected together into a single circuit card oriented substantially in a lateral-longitudinal plane. The first and second circuit card subassemblies are connected together by a longitudinally extending card connector. The first and second circuit card subassemblies have first and second operating temperatures, respectively. The first and second operating temperatures are different from one another. A plurality of thermal energy transfer devices is provided, with each thermal energy transfer device being operatively connected to an area of a corresponding circuit card correlated with a selected one of the first and second circuit card subassemblies. Each thermal energy transfer device at least partially induces the respective one of the first and second operating temperatures to a corresponding circuit card subassembly. Each thermal energy transfer device transversely overlies at least a supermajority of the corresponding circuit card subassembly and is longitudinally spaced from an other circuit card subassembly of the corresponding circuit card. At least one first temperature cooling manifold is in selective fluid communication with at least one thermal energy transfer device at least partially induce the first operating temperature. The first temperature cooling manifold selectively introduces a first cooling fluid into, and selectively removes the first cooling fluid from, the thermal energy transfer device at least partially inducing the first operating temperature. At least one second temperature cooling manifold is in selective fluid communication with at least one thermal energy transfer device at least partially inducing the second operating temperature. The second temperature cooling manifold selectively introduces a second cooling fluid into, and selectively removes the second cooling fluid from, the thermal energy transfer device at least partially inducing the second operating temperature. A plurality of manifold interfaces is provided. Each manifold interface is in fluid communication with a corresponding thermal energy transfer device. Each manifold interface is provided for selective fluid communication with a corresponding cooling manifold. A housing includes a first operating fluid inlet in fluid communication via the first temperature cooling manifold with a first operating fluid outlet and a second operating fluid inlet in fluid communication via the second temperature cooling manifold with a second operating fluid outlet. The housing supports and at least partially surrounds the plurality of circuit cards, the plurality of thermal energy transfer devices, the plurality of manifold interfaces, and the first and second temperature cooling manifolds.

In an embodiment, a method of providing immersion cooling in a compact-format circuit card environment is provided. The method comprises providing an apparatus including a plurality of circuit cards. Each circuit card includes first and second circuit card subassemblies. A plurality of thermal energy transfer devices is provided. Each thermal energy transfer device is associated with a corresponding circuit card subassembly. The first circuit card subassembly is configured for operation at a first operating temperature, and the second circuit card subassembly being configured for operation at a second operating temperature which is different from the first operating temperature. At least one first temperature cooling manifold and at least one second temperature cooling manifold are provided. Each thermal energy transfer device is operatively connected to an associated different one of the first and second circuit card subassemblies. The first circuit card subassemblies are at least partially exposed to the first operating temperature via placing at least one first temperature cooling manifold in selective fluid communication with a plurality of thermal energy transfer devices corresponding to the first circuit card subassemblies. A first cooling fluid is selectively introduced into, and selectively removed from, the thermal energy transfer devices which are operatively connected to the first circuit card subassemblies. The second circuit card subassemblies are at least partially exposed to the second operating temperature via placing at least one second temperature cooling manifold in selective fluid communication with a plurality of thermal energy transfer devices corresponding to the second circuit card subassemblies. A second cooling fluid is selectively introduced into, and selectively removed from, the thermal energy transfer devices which are operatively connected to the second circuit card subassemblies.

In an aspect, a system for providing immersion cooling in a compact-format circuit card environment is provided. The system comprises an apparatus comprising a plurality of circuit cards. Each circuit card includes first and second longitudinally spaced circuit card subassemblies, connected together into a single circuit card oriented substantially in a lateral-longitudinal plane. The first and second circuit card subassemblies are connected together by a longitudinally extending card connector. The first and second circuit card subassemblies have first and second operating temperatures, respectively. The first and second operating temperatures are different from one another. A plurality of thermal energy transfer devices is provided. Each thermal energy transfer device is operatively connected to an area of a corresponding circuit card correlated with a selected one of the first and second circuit card subassemblies. Each thermal energy transfer device at least partially induces the respective one of the first and second operating temperatures to a corresponding circuit card subassembly. Each thermal energy transfer device transversely over lies at least a supermajority of the corresponding circuit card subassembly and is longitudinally spaced from an other circuit card subassembly of the corresponding circuit card. At least one first temperature cooling manifold is in selective fluid communication with at least one thermal energy transfer device at least partially inducing the first operating temperature. The first temperature cooling manifold selectively introduces a first cooling fluid into, and selectively removes the first cooling fluid from, the thermal energy transfer device at least partially inducing the first operating temperature. At least one second temperature cooling manifold is in selective fluid communication with at least one thermal energy transfer device at least partially inducing the second operating temperature. The second temperature cooling manifold selectively introduces a second cooling fluid into, and selectively removes the second cooling fluid from, the thermal energy transfer device at least partially inducing the second operating temperature. A plurality of manifold interfaces is provided. Each manifold interface is in fluid communication with a corresponding thermal energy transfer device. Each manifold interface is configured for selective fluid communication with a corresponding cooling manifold. A housing includes a first operating fluid inlet in fluid communication via the first temperature cooling manifold with a first operating fluid outlet and a second operating fluid inlet in fluid communication via the second temperature cooling manifold with a second operating fluid outlet. The housing supports and at least partially surrounds the plurality of circuit cards, the plurality of thermal energy transfer devices, the plurality of manifold interfaces, and the first and second temperature cooling manifolds. A first cooling fluid source is in fluid supplying communication with the first temperature cooling manifold via the first operating fluid inlet. A second cooling fluid source is in fluid supplying communication with the second temperature cooling manifold via the second operating fluid inlet. A first cooling fluid destination is in fluid removing communication with the first temperature cooling manifold via the first operating fluid outlet. A second cooling fluid destination is in fluid removing communication with the second temperature cooling manifold via the second operating fluid outlet. A cabinet supports and at least partially encloses the apparatus, the first and second cooling fluid sources, and the first and second cooling fluid destinations.

BRIEF DESCRIPTION OF THE DRAWINGS

For a better understanding, reference may be made to the accompanying drawings, in which.

Description of Aspects of the Disclosure

This technology comprises, consists of, or consists essentially of the following features, in any combination.

Figure 1:
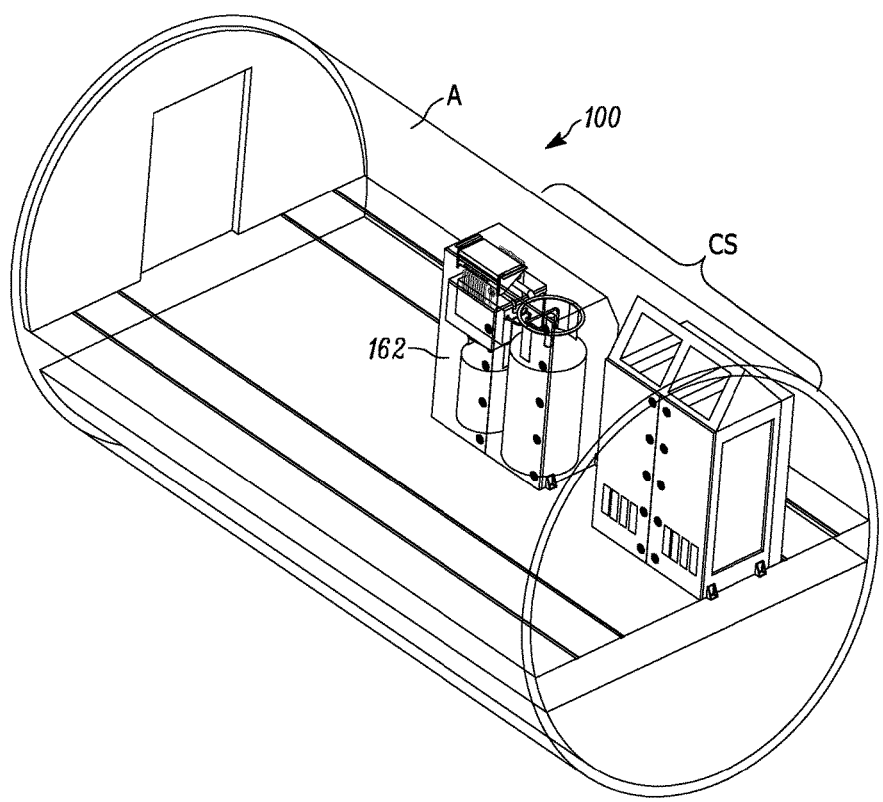
FIG. 1 is a schematic side perspective view of an example use environment for an aspect of the invention.
Figure 2:
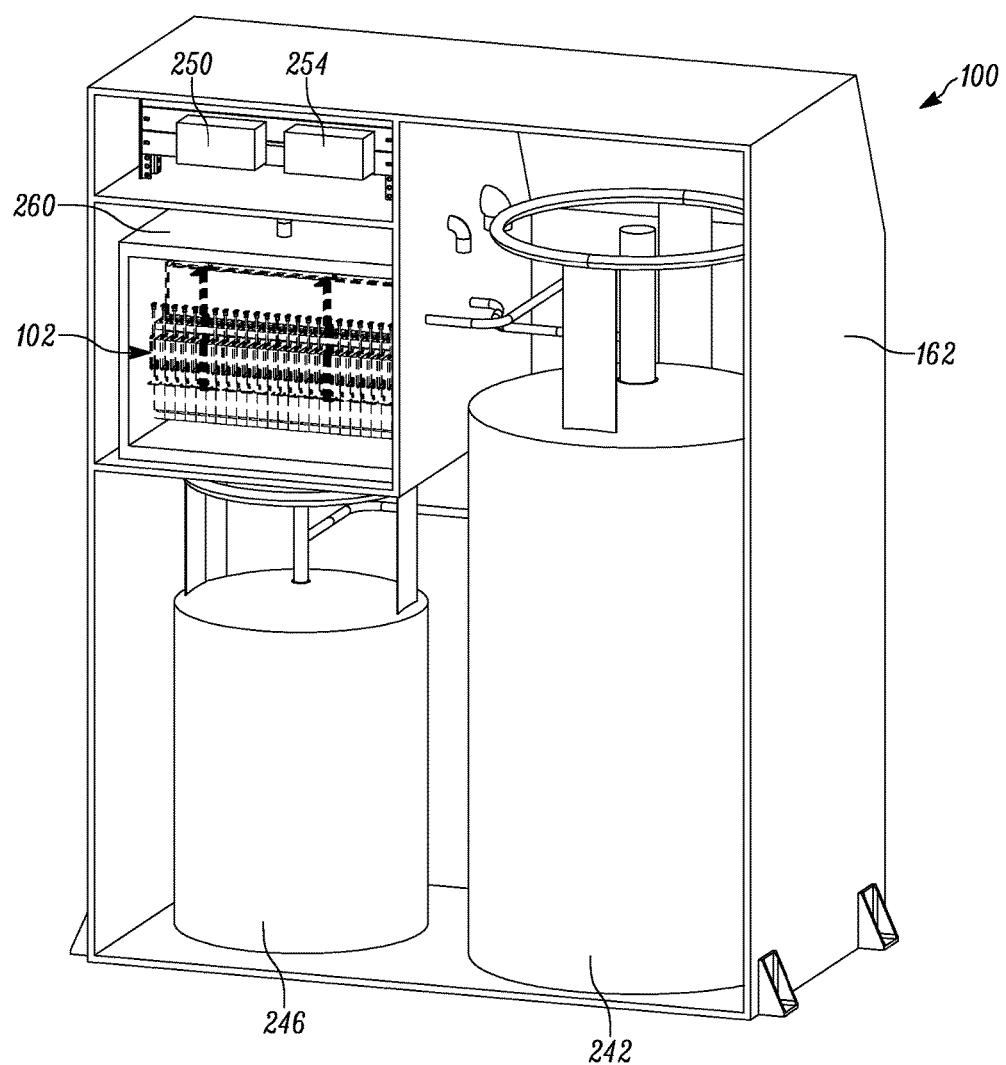
FIG. 2 is a schematic side perspective view of an aspect of the invention.
Figure 3:
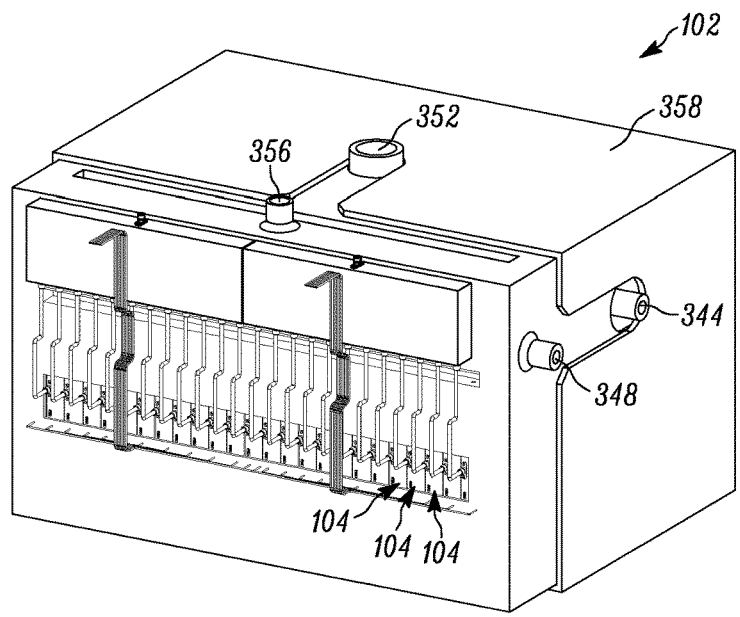
FIG. 3 is a schematic side perspective view of a component of the aspect of FIG. 2.

With reference to FIGS. 1-2, a cryogenic supercomputer (shown generally as "CS") may be desirably carried within an aircraft use environment (represented by a partial fuselage A in FIG. 1). For example, a cryogenic supercomputer CS could provide more than one hundred teraflops of computing capacity onboard an aircraft while consuming about fifty watts of electricity. This is significantly higher performance, with less power draw, than non-cryogenic computing systems currently available in aircraft applications. However, the cryogenic support systems needed to maintain appropriate operating temperatures (e.g., 4 K for RQL processors and 77 K for memory) require scarce space aboard the aircraft. Often, the low-temperature components of the cryogenic supercomputer are cooled with immersion cooling techniques. Accordingly, a system 100 can be configured for providing immersion cooling in a compact-format circuit card environment. The compact-format environment will be shown and described herein as an aircraft use environment, but one of ordinary skill in the art will understand that the system 100 could be used in any desired use environment, such as, but not limited to, one in which transportation and/or operating space is at a premium (e.g., submarine, spacecraft, remote scientific station, or the like).

Figure 9:
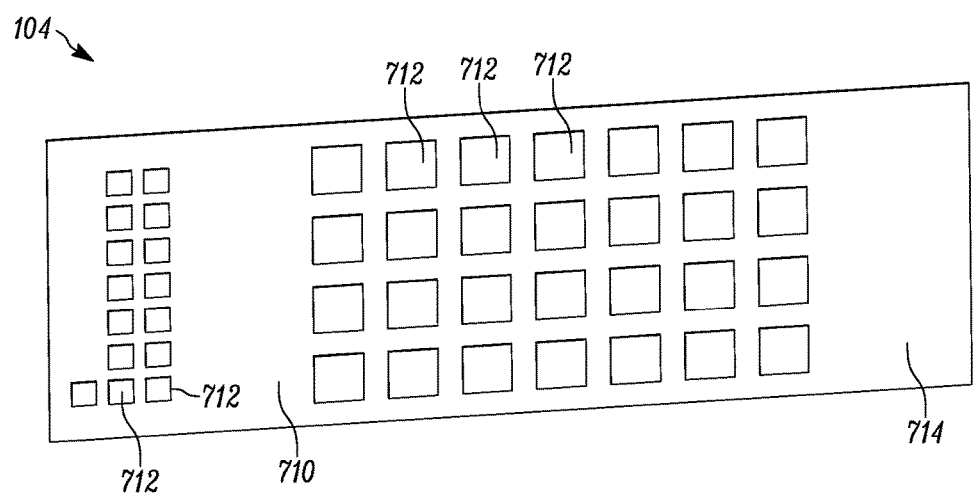
FIG. 9 is a schematic detail view of a component of the aspect of FIG. 2.

The system 100 includes at least one apparatus 102 for providing immersion cooling in a compact-format circuit card environment. The apparatus 102 includes a plurality of circuit cards 104, two example configurations of which are shown in partial phantom view in FIGS. 7A-7B. Each circuit card 104 includes first and second longitudinally spaced circuit card subassemblies 706 and 708, respectively, connected together into a single circuit card 104 oriented substantially in a lateral-longitudinal plane. The "longitudinal" direction is substantially parallel to arrow "Lo", and the "lateral" direction is substantially parallel to arrow "La:" in FIGS. 7A-7B, thus making the lateral-longitudinal plane substantially coincident with the plane of the page in those Figures. The first and second circuit card subassemblies 706 and 708 are connected together by a laterally extending card connector 710. The first and second circuit card subassemblies 706 and 708 could comprise, as in the example shown in FIG. 7A, two longitudinally spaced groups of IC chips 712 mounted on a single backing substrate 714—here, the backing substrate 714 serves also as a card connector 710. Thus, as shown in FIG. 9, the first and second circuit card subassemblies 706 and 708 are simply spaced-apart areas, each comprising a plurality of IC chips 712 mounted on, and extending transversely from, the single backing substrate 714. (The "transverse" direction is substantially perpendicular to both the longitudinal and lateral directions, and is into and out of the plane of the page in FIGS. 7A-7B, though is shown as arrow "T" in FIG. 11.)

Figure 7A:
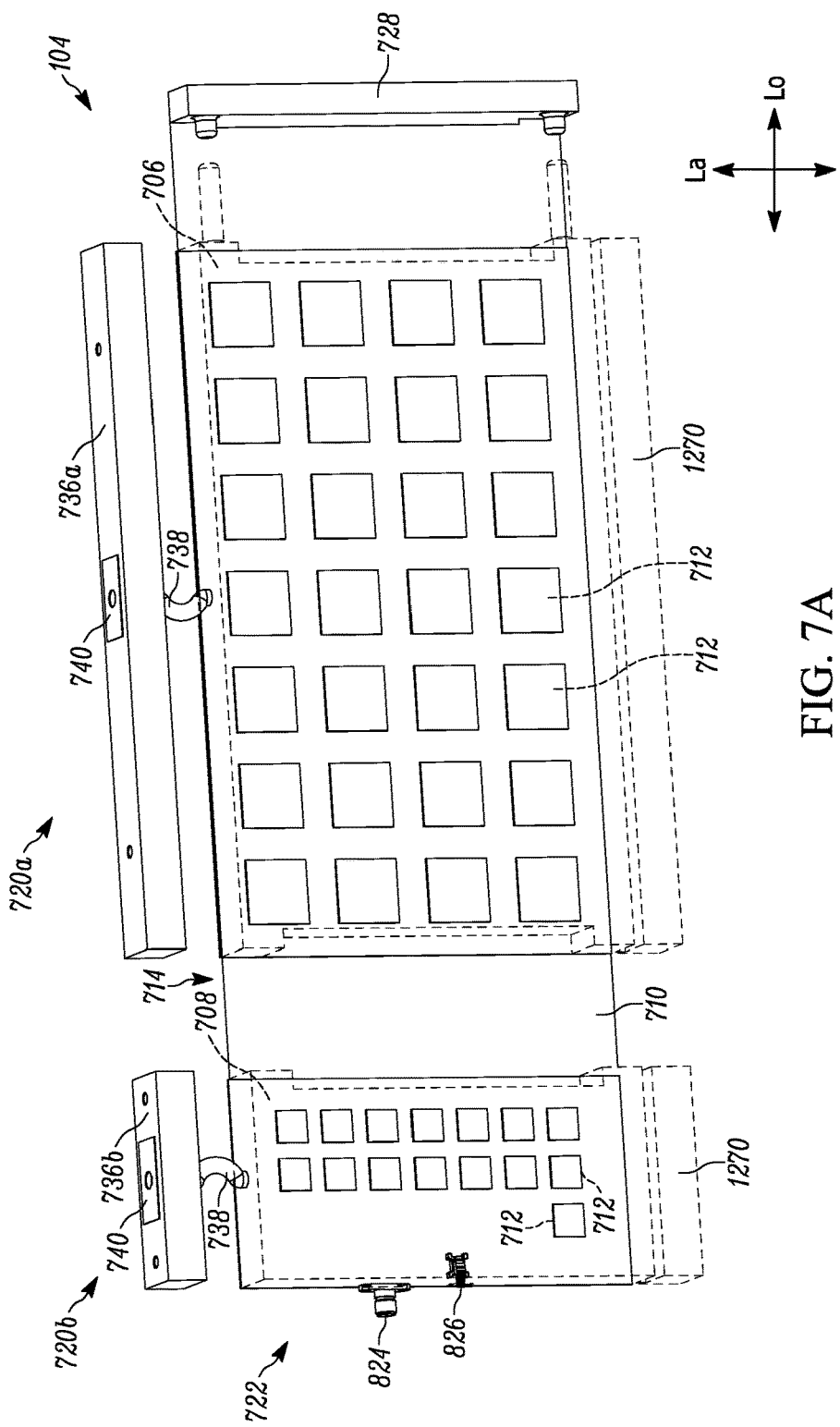
FIG. 7A is a front view of a component of the aspect of FIG. 2 in a first example configuration.
Figure 7B:
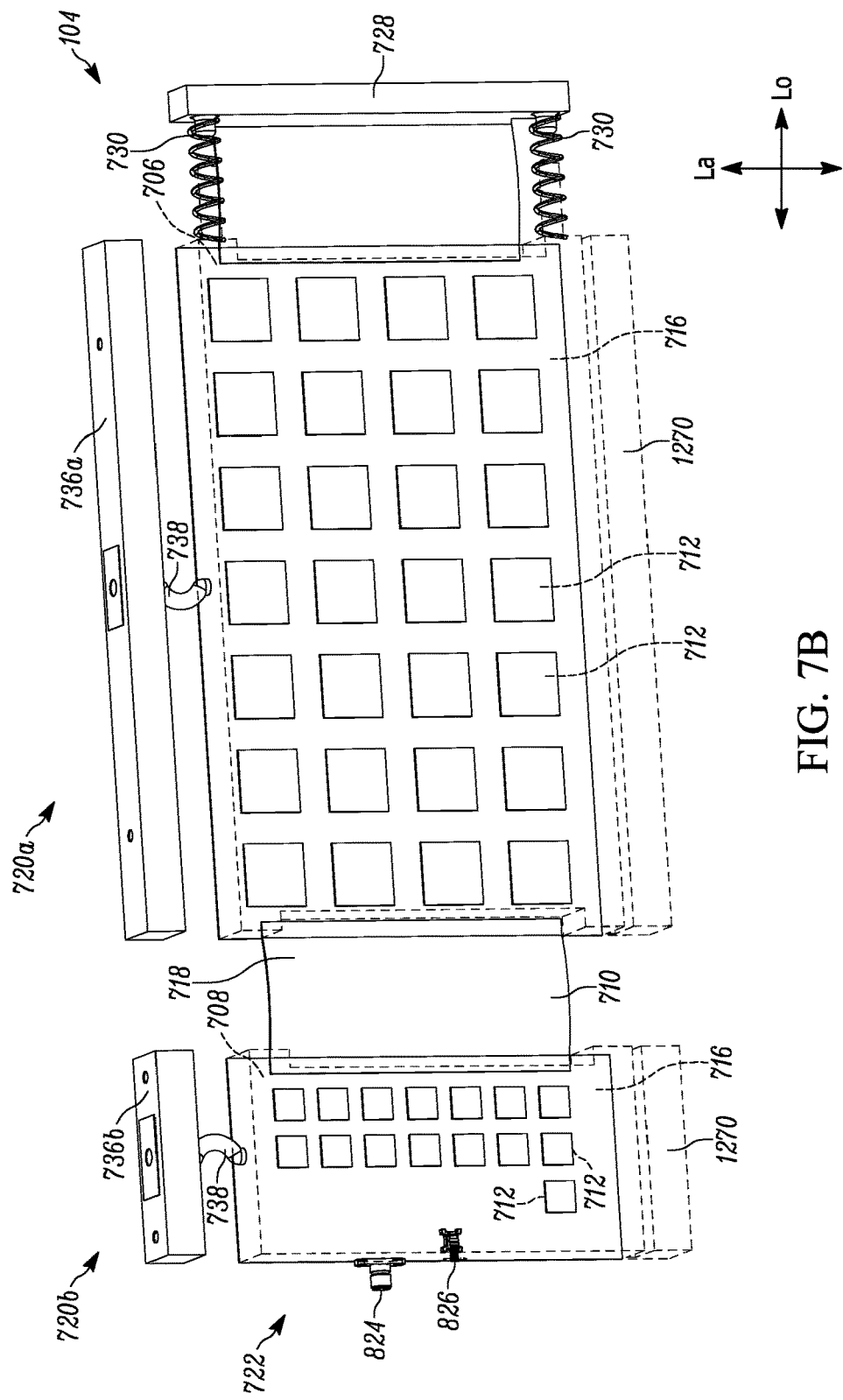
FIG. 7B is a front view of the component of FIG. 7A in a second example configuration.
Figure 11:
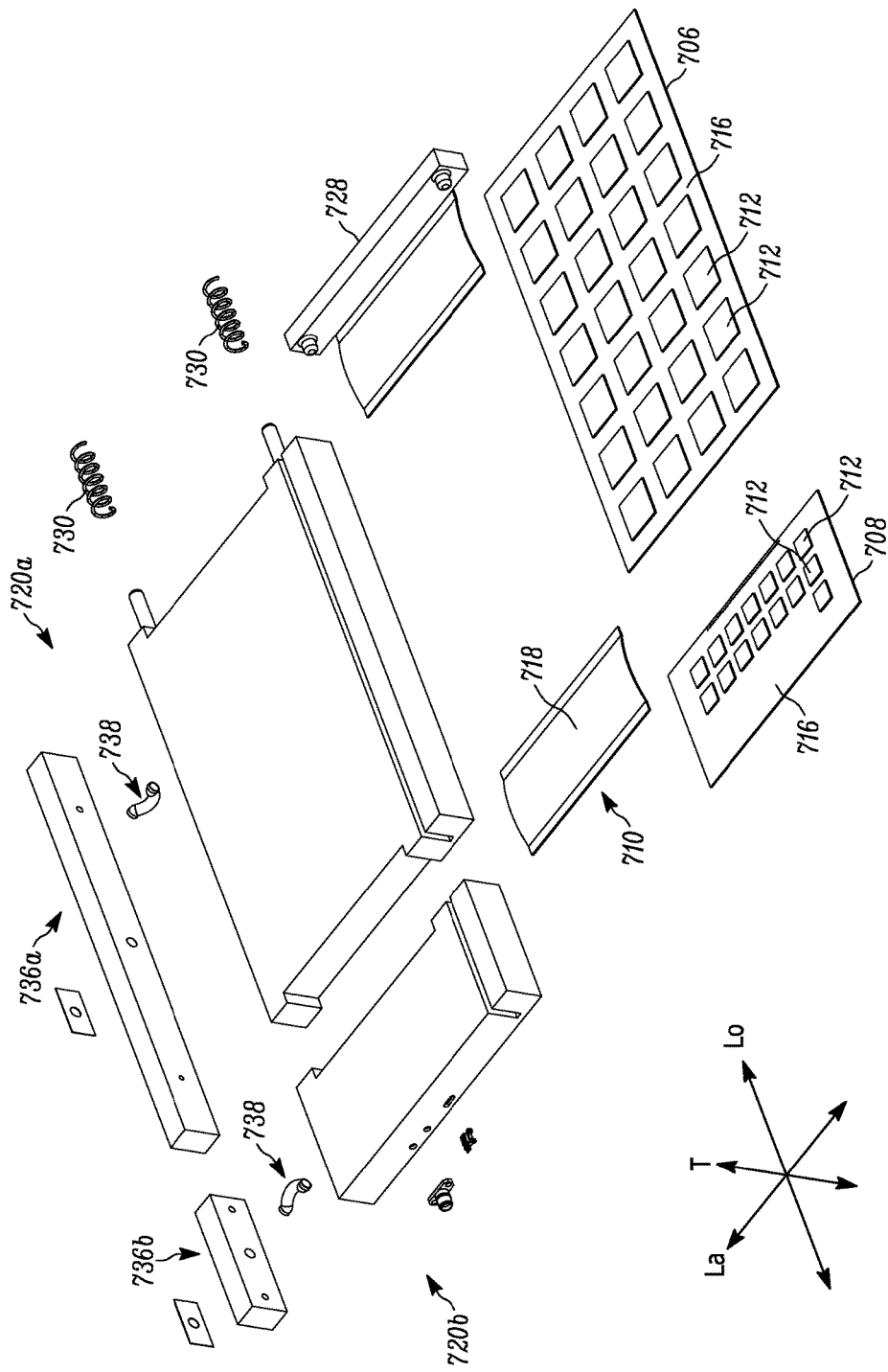
FIG. 11 is an exploded view of the component of FIG. 7A.

Additionally or alternatively, one or both of the first and second circuit card subassemblies 706 and 708 could comprise a plurality of IC chips 712 mounted on, and extending transversely from, a subassembly substrate 716, with two subassembly substrates 716 shown in FIGS. 7B and 11. The subassembly substrates 716 (before or after the IC chips 712 are mounted thereon) for a single circuit card 104 of the type shown in FIGS. 7B and 11 may then be, in turn, attached via one or more flexible card connectors 710 to achieve the desired longitudinal spacing for the first and second circuit card subassemblies 706 and 708. As shown in FIGS. 7B and 11, each card connector 710 comprises at least one longitudinally extending flexible interconnect 718. This "modular" construction (using subassembly substrates 716) is shown in at least FIGS. 7B and 11.

Stated differently, two longitudinally adjacent first and second circuit card subassemblies 706 and 708 can be maintained (via their inclusion in the apparatus 102) in close spatial proximity to each other, each at a different temperature, with low thermal parasitic heat transfer between first and second circuit card subassemblies 706 and 708 due to at least one of the cooling structures described herein and/or the presence of at least a portion of the card connector 710 (regardless of type) longitudinally between the first and second circuit card subassemblies 706 and 708.

One example of a suitable circuit card 104 is provided in U.S. Pat. No. 9,648,749, issued 9 May 2017 and entitled "CIRCUIT CARD ASSEMBLY AND METHOD OF PROVIDING SAME", incorporated herein by reference in its entirety. The presence of the circuit card 104, or portions thereof, may help to restrict at least one of magnetic, thermal, and radiation transmission longitudinally between the IC chips 712 of the first and second circuit card subassemblies 706 and 708. For example, the card connector 710 could act in a heat shielding and electro-magnetic interference ("EMI") shielding capacity.

In other words, the first and second circuit card subassemblies 706 and 708 may be connected together by a longitudinally extending card connector 710 (shown and described herein as either a portion of the backing substrate 714—FIG. 7A—or the flexible interconnect 718 of FIG. 7B), oriented in a parallel lateral-longitudinal plane to the first and second circuit card subassemblies 706 and 708. (It should be noted that, as in the case of the single backing substrate 714, the first and second circuit card subassemblies 706 and 708 can be considered to be oriented in the same lateral-longitudinal plane as the card connector 710.) As in the arrangement of FIGS. 7B and 11, each circuit card subassembly 706 and 708 may include a plurality of IC chips 712 extending transversely from a subassembly substrate 716. Each subassembly substrate 716 in the arrangement of FIGS. 7B and 11 may be connected to another subassembly substrate 716 by a flexible interconnect 718.

However, in all of the depicted circuit cards 104, the first and second circuit card subassemblies 706 and 708 may be spaced longitudinally apart, with a longitudinally intervening portion of the card connector 710. The card connector 710 may be less thermally conductive than either of the first and second circuit card subassemblies 706 and 708, which may assist in preventing parasitic heat transfer between the first and second circuit card subassemblies 706 and 708 in some use environments.

The IC chips 712 of a single circuit card 104 may have different temperature requirements. For example, the longitudinally rightmost (in the orientation of FIGS. 7A-7B) array of IC chips 712 (e.g., those on the first circuit card subassembly 706) could have a desired operating temperature in the range of about 2-6K, such as about 4K. Similarly, the longitudinally leftmost (in the orientation FIGS. 7A-7B) array of IC chips 712 (e.g., those on the second circuit card subassembly 708) could have a desired operating temperature in the range of about 75-79K, such as about 77K. As described below, the apparatus 102 can help provide a desired temperature-differential environment for the first and second circuit card subassemblies 706 and 708, and the card connector 710 (regardless of type) can assist with thermal efficiency by blocking, among other energies, thermal energy transfer longitudinally between the first and second circuit card subassemblies 706 and 708. Having greater physical separation between the first and second first and second circuit card subassemblies 706 and 708 increases the thermal isolation; however, it also increases the signal loss and latency. A balance should be struck, by one of ordinary skill in the art, between acceptable signal loss/latency and thermal isolation to determine the optimal separation for a particular use environment.

The first and second circuit card subassemblies 706 and 708, as previously mentioned, may have first and second operating temperatures, respectively. The first and second operating temperatures are different from one another. A plurality of thermal energy transfer devices 720, which will be discussed at length below, are provided, with each thermal energy transfer device 720 being operatively connected to an area of the circuit card 104 correlated with a selected one of the first and second circuit card subassemblies 706 and 708. Each thermal energy transfer device 720 at least partially induces the respective, or appropriate, one of the first and second operating temperatures to the selected circuit card subassembly 706 and 708 with which that thermal energy transfer device 720 is associated. The thermal energy transfer device 720 transversely overlies at least a supermajority of the selected circuit card subassembly 706 and 708 and is laterally spaced from the other circuit card subassembly 706 and 708, as depicted in the Figures. There may be one or more thermal energy transfer devices 720 provided to each apparatus 100, as desired.

With reference to FIGS. 7A-7B, the thermal energy transfer device 720 may be a first thermal energy transfer device 720a. The apparatus 102 may also include a second thermal energy transfer device 720b operatively connected to an area of the circuit card 104 correlated with the other one of the first and second circuit card subassemblies 706 and 708 (i.e., not the selected one of the first and second circuit card subassemblies 706 and 708 with which the first thermal energy transfer device 720a is correlated). The second thermal energy transfer device 720b may be provided for at least partially inducing the respective, and appropriate, one of the first and second operating temperatures to the other circuit card subassembly 706 and 708. The first and second thermal energy transfer devices 720a and 720b transversely overlie at least a supermajority of the respective first or second circuit card subassembly 706 or 708 and are laterally spaced from the other circuit card subassembly 706 or 708.

The thermal energy transfer devices 720 may be in direct thermally conductive contact with at least a portion of the selected circuit card subassembly 706 and 708 as shown in FIGS. 7A-7B, in order to assist with heat transfer between these two structures. In some use environments, the thermal energy transfer devices 720 may be a circulating-coolant heat sink; this is the arrangement shown and described herein. The thermal energy transfer devices 720 could, for some use environments of the system 100, be similar to those disclosed in U.S. patent application Ser. No. 15/916,019, filed 8 Mar. 2018 and entitled "IMMERSION COOLING TEMPERATURE CONTROL METHOD, SYSTEM AND APPARATUS", incorporated herein by reference in its entirety.

FIGS. 7A-7B show two example configurations of circuit card units 722. The first and second thermal energy transfer devices 720a and 720b have been placed into thermally significant proximity with their respective first and second circuit card subassemblies 706 and 708. "Thermally significant proximity" is used herein to indicate a degree of physical closeness between the "proximate" structures which facilitates a desired direction, type, and amount of heat transfer. For example, "thermally significant proximity" includes, but is not limited to, one or more of direct contact for thermal conduction and a spaced relationship for thermal convection and/or radiation. The thermal energy transfer device(s) 720 can have any desired form factor or configuration. For example, when the first and second circuit card subassemblies 706 and 708 and/or the backing substrate 714 are planar, the thermal energy transfer device(s) 720 may have a substantially planar or flat surface (e.g., an "underside") which is placed into thermally significant proximity to those structures.

The relationship between the first and second thermal energy transfer devices 720a and 720b and their respective first and second circuit card subassemblies 706 and 708 (as well as the other components of the same circuit card unit 722, some of which will be described below) may be established and maintained in any desired manner and with any suitable assistance including, but not limited to, one or more of frictional fit, adhesives, mechanical fastener(s) or other attachment structures, gravity, magnetics, soldering/welding, or the like. As with all aspects of the described system 100, one of ordinary skill in the art will be able to produce a suitable circuit card unit 722 according to aspects of the present invention for a particular use environment based upon the current description and depictions.

Figure 8:
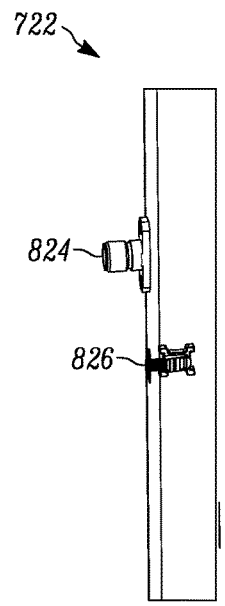
FIG. 8 is a schematic detail view of a component of the aspect of FIG. 2.

With reference to FIGS. 7A-7B and 8, each circuit card unit 722 could include any number of desired input and/or output connectors for electrically interconnecting the circuit card 104, or components thereof, with other circuit cards 104, an outside computer, a power source, or any other desired connection devices. For example, as shown in FIG. 8, a clock input 824 and/or an optical I/O 826 could be provided in any desired manner. Similarly, as shown in FIGS. 7A-7B and 11, a network interface board connector 728 could be provided to the circuit card 104. It is contemplated that, for most use environments, the network interface board connector 728 will be connected to the first and second circuit card subassemblies 706 and 708 analogously to the way that the first and second circuit card subassemblies 706 and 708 are connected to each other via a card connector 710. That is, when the card connector 710 is a portion of the backing substrate 714 as in FIG. 7A, the network interface board connector 728 will be connected to the first and second circuit card subassemblies 706 and 708 via connection to a portion of the backing substrate 714.

Conversely, when the card connector 710 is a flexible interconnect 718, the network interface board connector 728 will also be connected to the first and second circuit card subassemblies 706 and 708 via a flexible interconnect 718 as shown in FIGS. 7B and 11. As shown in those Figures, at least one spring 730 (two shown) may be used to help dampen or cushion motion of the network interface board connector 728 relative to the first and/or second circuit card subassembly 706 or 708, as desired.

Though FIGS. 7A-7B depict examples of circuit card units 722 with differing substrate 714, 716 and card connector 710 configurations, the system 100 is agnostic as to which of these types of configurations, or any other configurations (whether or not shown and described herein) which could be used. Accordingly, the below description of the system 100, and components/features thereof, should be considered to apply equally to either of the circuit card unit 722 configurations of FIGS. 7A-7B, or to any other desired circuit card unit configuration.

Figure 4:
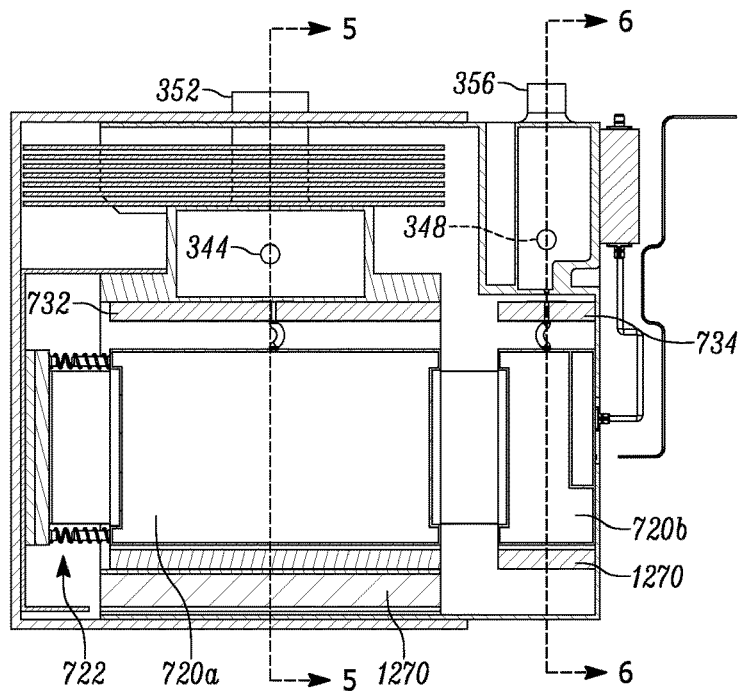
FIG. 4 is a schematic partial front view of the component of FIG. 3.
Figure 5:
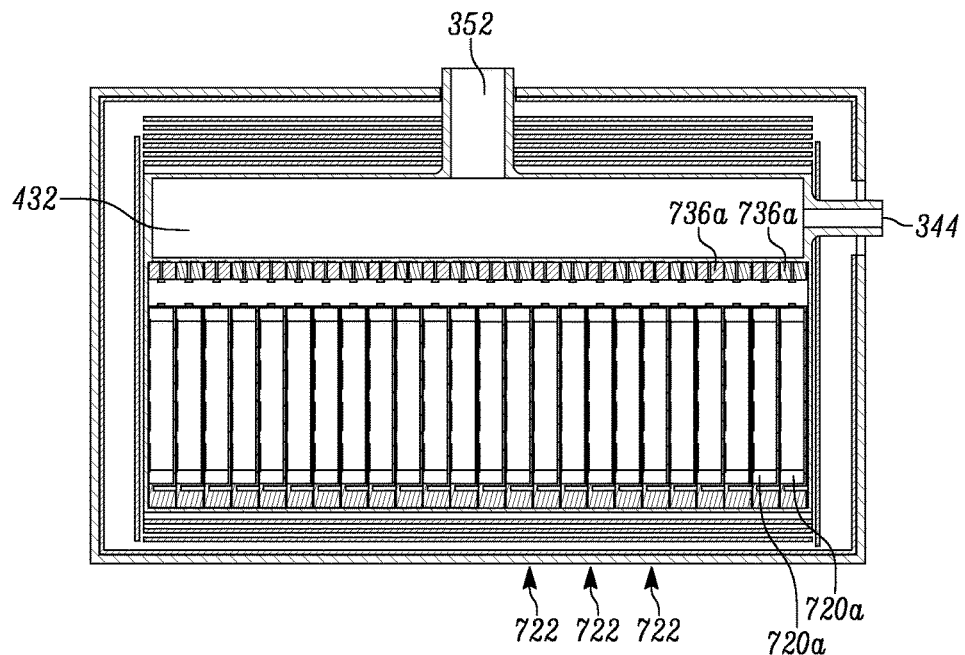
FIG. 5 is a cross-sectional view taken along line 5-5 of FIG. 4.
Figure 6:
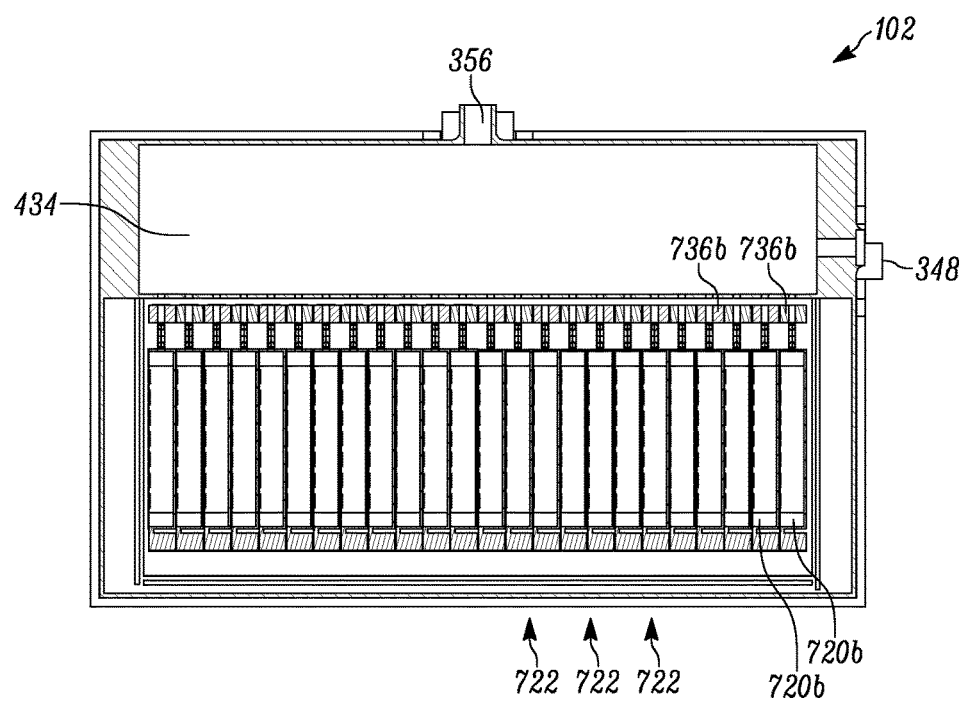
FIG. 6 is a cross-sectional view taken along line 6-6 of FIG. 4.

As shown in FIGS. 4-6, each apparatus 100 may include at least one first temperature cooling manifold 432 in selective fluid communication with at least one thermal energy transfer device 720a for at least partially inducing the first operating temperature. The first temperature cooling manifold 432 selectively introduces a first cooling fluid into, and selectively removes the first cooling fluid from, the thermal energy transfer device 720a which is at least partially inducing the first operating temperature. Each circuit card unit 722 may also include at least one second temperature cooling manifold 434 in selective fluid communication with at least one thermal energy transfer device 720b for at least partially inducing the second operating temperature. The second temperature cooling manifold 434 selectively introduces a second cooling fluid into, and selectively removes the second cooling fluid from, the thermal energy transfer device 720b at least partially inducing the second operating temperature.

Figure 10:
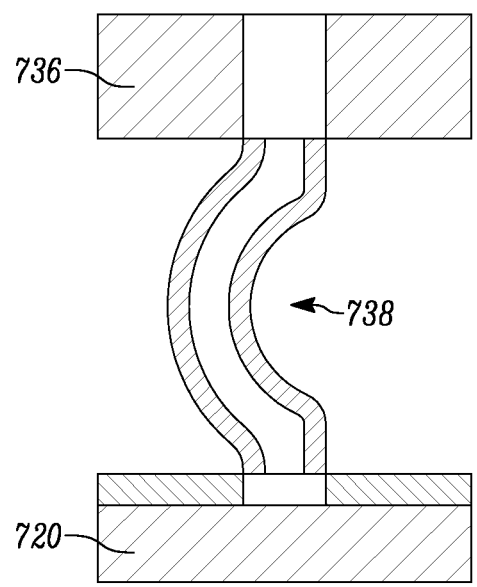
FIG. 10 is a schematic detail view of a component of the aspect of FIG. 2.

As shown in FIGS. 7A-7B and 11, the apparatus 102 may include a plurality of manifold interfaces 736, with each manifold interface 736 being in fluid communication with a corresponding thermal energy transfer device 720. By way of example, manifold interface 736a is in fluid communication with thermal energy transfer device 720a, and manifold interface 736b is in fluid communication with thermal energy transfer device 720b. Stated differently, each manifold interface 736 is in bidirectional fluid communication with a corresponding thermal energy transfer device 720 via an interface connector 738, as shown in FIG. 10.

The interface connector 738 is shown as a "gooseneck" type, with a curved center section to allow for stress relief under thermal expansion and/or relative movement (e.g., "swinging" due to aircraft motion) of the manifold interface 736 and the corresponding thermal energy transfer device 720. As will be described below, in certain use environments of the system 100, liquid-phase coolant is routed downward (in the orientation of FIG. 10) from the manifold interface 736 into the thermal energy transfer device 720 through the interface connector 738 sequentially and/or concurrently with "bubbles" of vapor-phase coolant rising upward (in the orientation of FIG. 10) from the thermal energy transfer device 720 through the interface connector 738 toward the manifold interface 736. As a result, liquid-phase coolant can be provided from a cooling manifold 432 or 434, through the manifold interface 736 and the interface connector 738, and then directed (e.g., pumped) into the thermal energy transfer device 720 to "wash" across at least a portion of a circuit card subassembly 706 and/or 708. As the liquid coolant circulates (e.g., via convection) within the thermal energy transfer device 720, it is at least partially sublimated into vapor coolant due to the heat absorbed into the coolant from the IC chips 712. The vapor coolant then will naturally rise through the interface connector 738 (which could occur concurrently with flow of liquid coolant in the opposite direction through the same interface connector 738) for removal from the thermal energy transfer device 720 through the manifold interface 736. It is contemplated that at least a portion of the coolant could remain liquid during this cycle through the thermal energy transfer device 720 and the interface connector 738, particularly if the liquid coolant is being pumped into the thermal energy transfer device 720 under pressure which would naturally force a portion of the existing liquid coolant out of the thermal energy transfer device 720 along with the vapor coolant. It is also contemplated that expansion of the liquid coolant into vapor coolant may naturally urge some of the liquid and/or vapor coolant out of the thermal energy transfer device 720 through the interface connector 738.

Each manifold interface 736 is also configured for selective fluid communication with a corresponding cooling manifold 432, 434, as shown in more detail in at least FIGS. 3-6. As shown particularly in FIGS. 5-6, each cooling manifold 432, 434 serves a plurality of circuit card units 722 by supplying cooling fluid to, and removing cooling fluid from, the manifold interfaces 736 using manifold ports 740. Each manifold port 740 of each manifold interface 736 is in fluid communication with a corresponding cooling manifold 432, 434, depending upon which of the first and second operating temperatures is intended to be induced by the respective connected thermal energy transfer device 720. If one or more circuit card units 722 are not desired to be cooled for some reason, the manifold port 740 can be blocked to prevent cooling fluid being supplied thereto.

The cooling fluid(s) can be supplied to, and removed from, the apparatus 102 in any desired manner. With specific reference to FIGS. 2-3, a first cooling fluid source 242 (e.g., a "cool side" Dewar of liquid helium, at about 4 K) is in fluid supplying communication with the first temperature cooling manifold 432 via a first operating fluid inlet 344. A second cooling fluid source 246 (e.g., a "hot side" Dewar of liquid nitrogen, at about 77 K) is in fluid supplying communication with the second temperature cooling manifold 434 via a second operating fluid inlet 348. Though the cryogenic fluids described herein could be compressed on board an airplane, it is contemplated that, for most use environments of the system 100, compressed cryogenic liquids could be provided, for example, using the infrastructure accommodations for gas liquefaction which are commonly available at aircraft facilities. As a result of use of the system 100 and the first and second cooling fluid sources 242 and 246, weight and power consumption on board the aircraft can be reduced from that which otherwise would be needed to initially produce/compress cryogenic liquids on board. It is believed that first and second cooling fluid sources 242 and 246 having capacities and form factors well within the capabilities of current aircraft accommodations could support cryogenic cooling for supercomputer usage of even extremely lengthy airplane flights (e.g., a 12-hour flight using commercial Dewars, a 24-hour flight using Dewars which are custom-shaped for the cabinet 162, or any other desired flight time via provision of appropriate amounts and types of cooling fluid(s)), through use of the system 100.

Once the cooling fluid(s) have been passed through the apparatus 102 as described, they will normally be in a largely vapor phase and could be considered "waste" products. Therefore, the system 100 may include a first cooling fluid destination (shown schematically at 250) in fluid removing communication with the first temperature cooling manifold 432 via a first operating fluid outlet 352. For example, when the first cooling fluid is liquid and/or vapor helium, the helium may be re-compressed as desired and stored as a compressed gas at ambient temperature. If it is not stored, the helium gas could be vented outside the aircraft, but helium gas has some value and would likely be recaptured. A second cooling fluid destination (shown schematically at 254) is in fluid removing communication with the second temperature cooling manifold 434 via a second operating fluid outlet 356. For example, when the second cooling fluid is liquid and/or vapor nitrogen, this fluid has little value, and with the most likely be vented outside the aircraft, unless there was a reason for the nitrogen to be re-compressed as desired and stored in much the same way as mentioned above for helium. Because of uncertainty as to the ultimate desired nature of the first and second cooling fluid destinations 250 and 254, it is presumed that whatever component within the system 100 is connected to the first and second operating fluid outlet 352 and 356, respectively, is considered as a first or second cooling fluid destination 250 and 254, even if the "waste" or "spent" cooling fluid is ultimately routed outside the system 100 for further processing and/or to be employed in other cooling applications aboard the aircraft, for maximum utility. One of ordinary skill in the cryogenics arts will be able to provide suitable cooling fluid flow paths, supplies, and piping for a particular use environment of aspects of the present invention.

As shown in FIGS. 3-6, the apparatus 102 includes a plurality of circuit card units 722 aggregated inside a housing 358, as will be described in detail below. The housing 358 includes the first operating fluid inlet 344 in fluid communication via the first temperature cooling manifold 432 with the first operating fluid outlet 352, as well as the second operating fluid inlet 348 in fluid communication via the second temperature cooling manifold 434 with the second operating fluid outlet 356. In other words, the housing 358 includes the necessary connections to route cooling fluid in a "loop" or "cycle" type manner past the circuit cards 104, as described above with reference to at least FIGS. 7A-11. The housing 358 supports and at least partially surrounds at least the plurality of circuit cards 104, the plurality of thermal energy transfer devices 720, the plurality of manifold interfaces 736, and the first and second temperature cooling manifolds 432 and 434. The housing 358 may be contained in a vacuum ambient environment, such as within vacuum cabinet 260 shown in FIG. 2. The housing 358 helps to assist the apparatus 102 to be transported and handled as a one-piece unit.

As shown in FIGS. 1-2, a cabinet 162 may support and at least partially enclose at least one apparatus 102, the first and second cooling fluid sources 242 and 246, and the first and second cooling fluid destinations 250 and 254 (with the understanding that the first and second cooling fluids may eventually be passed to an ultimate destination outside the cabinet 162, as desired). It is contemplated that the cabinet 162 is configured and/or selected based upon its ability to physically enter and fit into a particular aircraft use environment, optionally with minimal wasted space. For example, the components of the system 100 could be configured to fit within a cabinet 162 having standardized dimensions for a certain make and model of aircraft, as desired.

Figure 12:
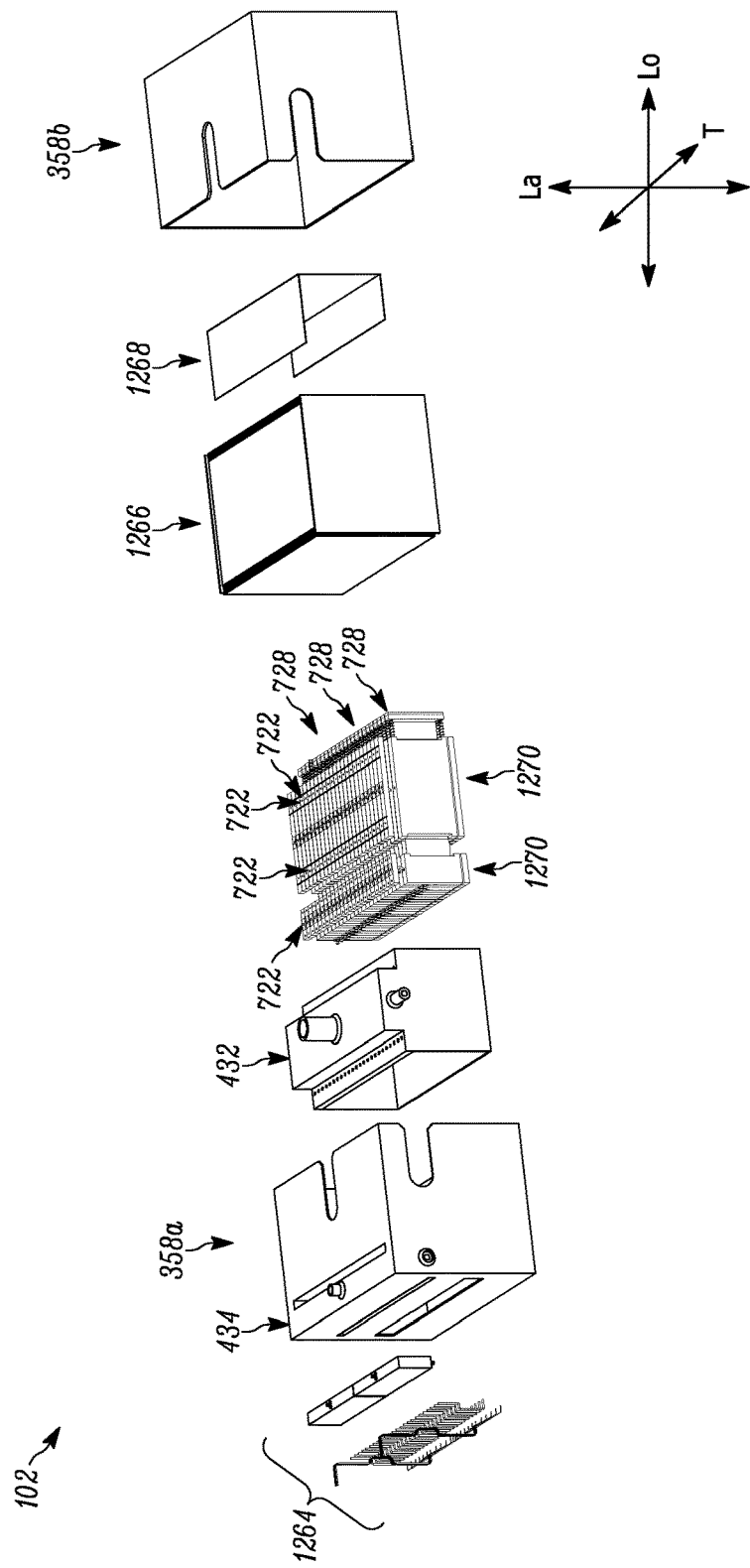
FIG. 12 is an exploded front view of the component of FIG. 3.

Turning now to FIG. 12, an exploded view of the apparatus 102 is shown. Here, the housing 358a, 358b is a two-piece "nesting" construct which supports and encloses the other components of the apparatus 102 a variety of electrical cables and connections 1264 are shown schematically at the left side of FIG. 12, but could attach to any desired portion of the apparatus 102 or components thereof. In the configuration shown in FIG. 12, the second temperature cooling manifold 434 is shown as being integrated into one of the pieces of the housing 358a. The first temperature cooling manifold 432 then slips into that piece of the housing 358a. A plurality of circuit card units are in the innermost portion of the housing 358, and (if desired) an insulating blanket 1266 may surround at least a portion of the apparatus 102 components within the housing 358. A network interface board assembly 1268 is placed into electrical content with the plurality of network interface board connector 728 of the circuit card units.

It should be noted that at least one suspension joint 1270 may be provided to one or more of the circuit card units 722. When present, at least one of the plurality of circuit cards 104 may be supported by the housing 358 via a corresponding suspension joint 1270 to allow relative transverse movement (i.e., substantially into and out of the plane of the page, in the orientation of FIG. 12) between the housing 358 and the corresponding circuit card 104. For example, the suspension joint 1270 may pivotally attach the corresponding circuit card 104 to the housing 358 for relative pivotal movement between the housing 358 and the corresponding circuit card 104. Relative motion between a circuit card 104, or circuit card units 722, in the housing 358 may occur due to motion of the aircraft and/or cabinet 162, such as during installation of the cabinet 162 and/or turbulent flight of the aircraft. Potentially with the assistance of the flexible features of the interface connectors 738 and the suspension joints 1270, desired mechanical and electrical contact can be maintained between portions of the apparatus 102, and incidental motion can be "damped" or absorbed in a way that allows the apparatus 102 to continue operation and avoid damage, even during relatively significant motion, including severe air turbulence.

One of ordinary skill in the art can provide an apparatus 102 and system 100 suitable for a desired use environment, based upon the teachings of the present application. However, one example sequence of assembly of the apparatus 102 shown in FIG. 12 is depicted schematically in FIGS. 13A-13I.

Figure 13A:
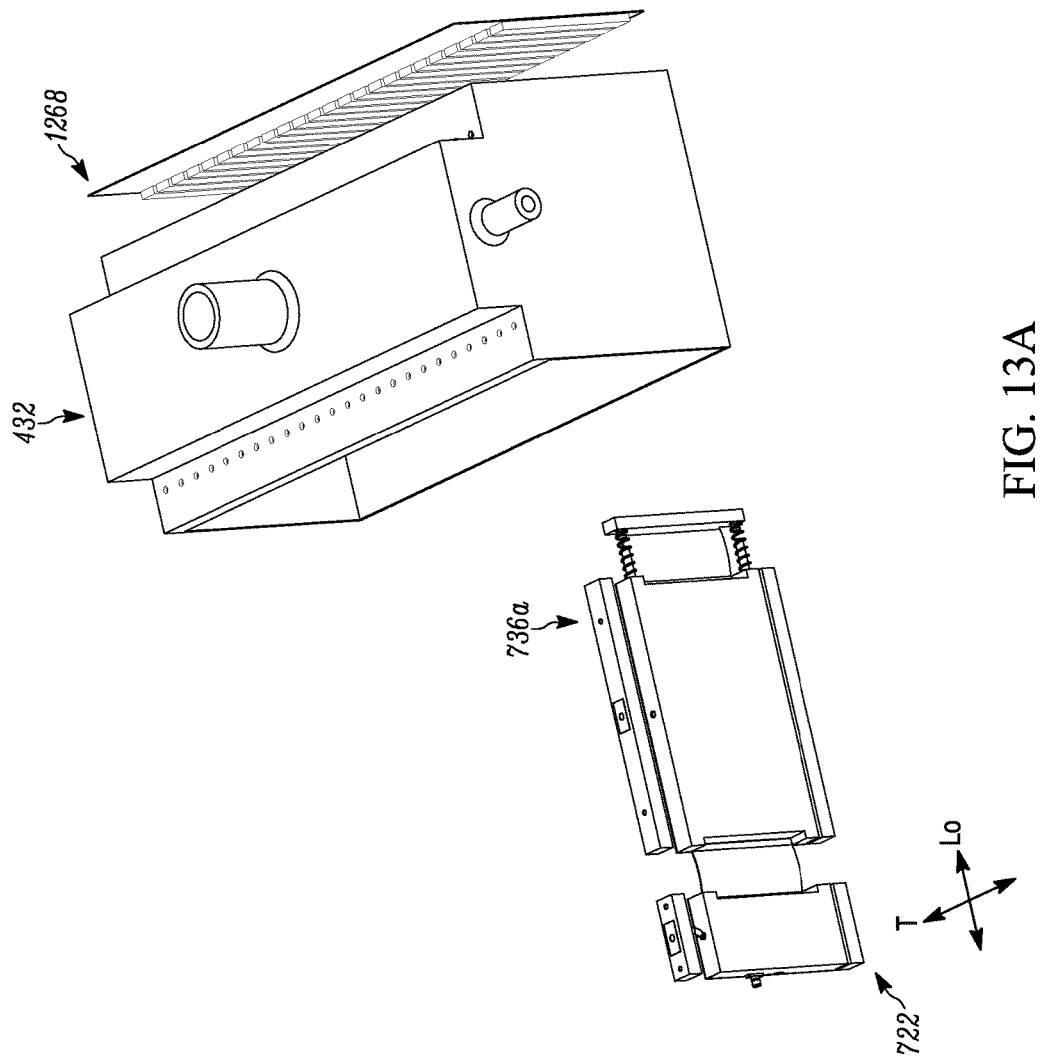
FIGS. 13A-13I schematically depict an example sequence of construction of the aspect of FIG. 3.
Figure 13B:
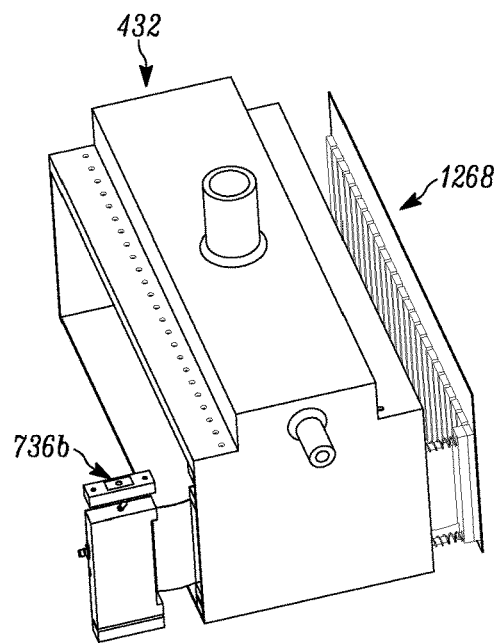
Figure 13C:
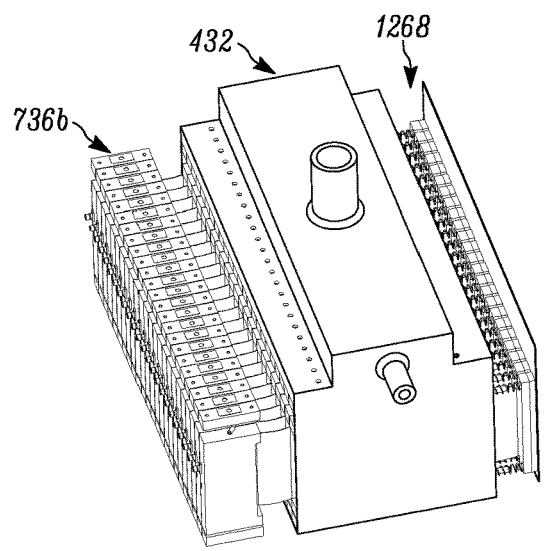

In FIG. 13A, the network interface board assembly 1268 and first temperature cooling manifold 432 have already been assembled together. A circuit card unit 722 is shown as being inserted longitudinally into a "backplane" comprising the first temperature cooling manifold 432 and associated structures, and the network interface board assembly 1268. In FIG. 13B, the inserted circuit card unit 722 is fastened into place in any desired manner, to bring the first temperature cooling manifold 432 into fluid connection with the manifold interface 736a. The sequence of FIGS. 13A-13B is repeated as many times as desired, once for each circuit card unit 722 (24 shown) included in the apparatus 102—the configuration of FIG. 13C is then achieved. Effectively, in forming the construct shown in FIG. 13C, each of the plurality of circuit cards 104 becomes transversely positioned with respect to an adjacent circuit card 104, with at least one thermal energy transfer device 720 interposed transversely between each transversely adjoining pair of circuit cards 104.

Figure 13D:
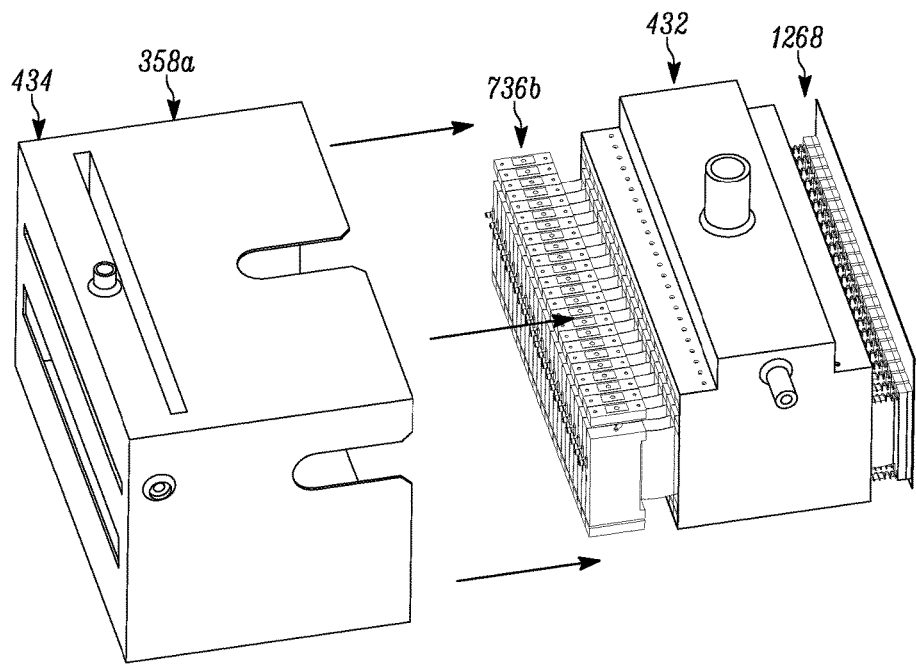
Figure 13E:
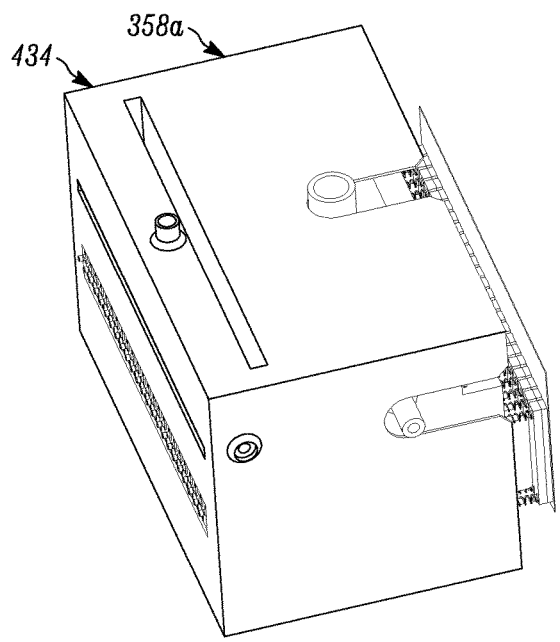
Figure 13F:
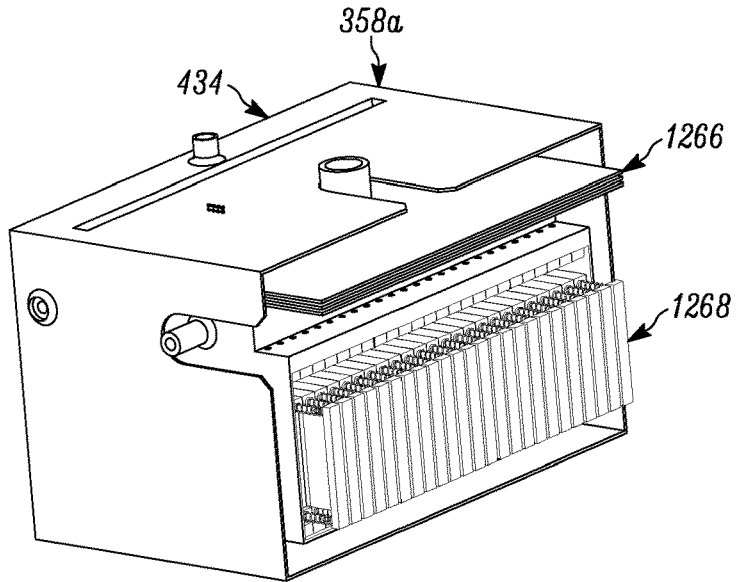

In FIG. 13D, one piece of the housing 350 8A, with the second temperature cooling manifold 434 integrated therein, is slid around the subassembly shown in FIG. 13C. This will bring the manifold interfaces 736b into fluid contact with the second temperature cooling manifold 434, and these two structures are placed into fluid connection and fastened as desired in FIG. 13E. As shown in FIG. 13 F, at least a portion of the insulating blanket 1266 is inserted into the first piece of the housing 358a, which may help in thermally insulating the first temperature cooling manifold 432 and second temperature cooling manifold 434 from each other. The insulating blanket 1266, when present, may also or instead insulate components of the apparatus 102 from ambient space or from each other, as desired.

Figure 13G:
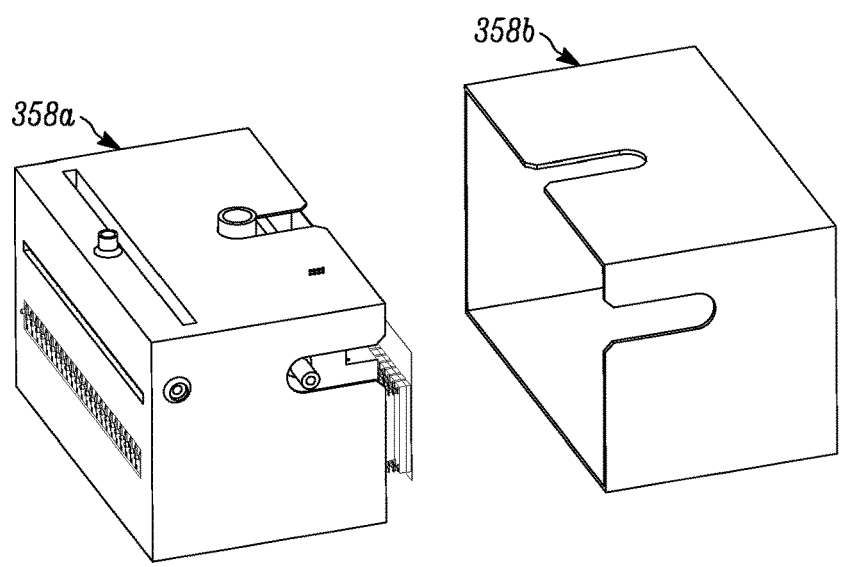
Figure 13H:
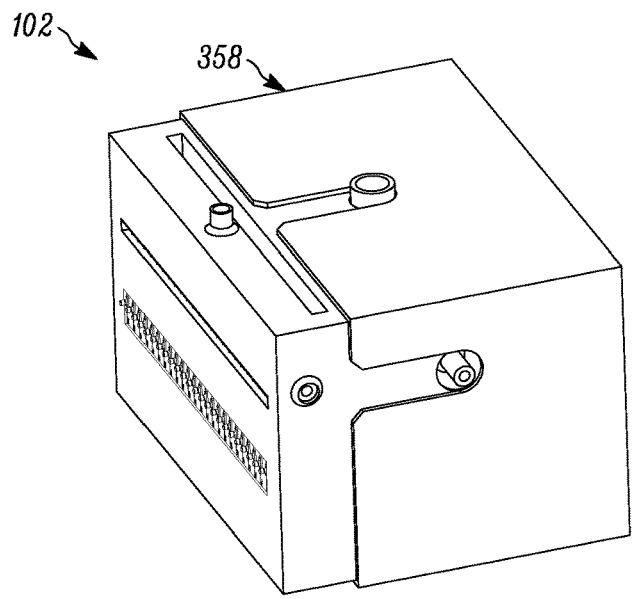
Figure 13I:
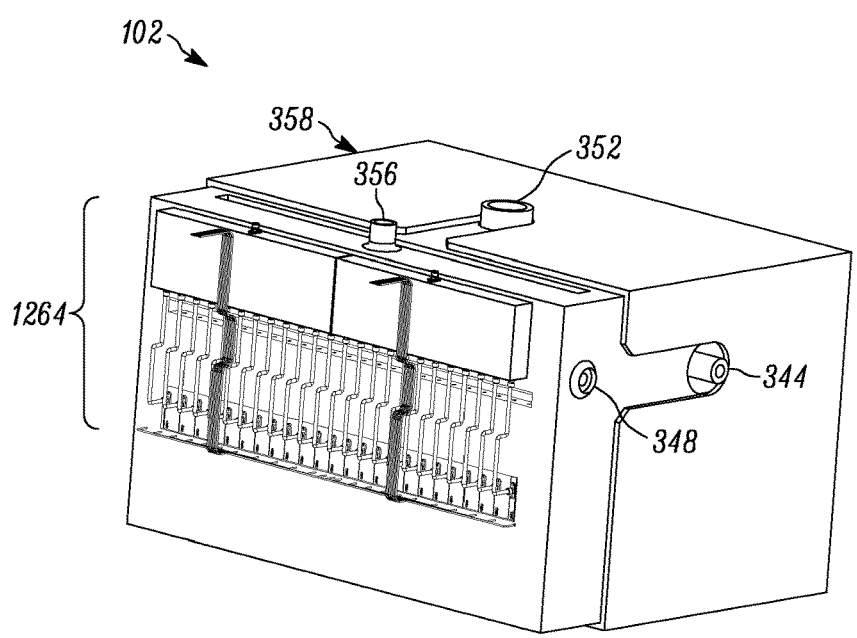

In the sequence of FIGS. 13G-13H, the second piece of the housing 358b is slid into the first piece 358a, to create an assembled apparatus 102. In FIG. 13I, any desired electrical cables or connections 1264 can be put in place in order to facilitate usage of the apparatus 102. Since the housing 358 exposes the first and second cooling fluid inlets 344 and 348, as well is the first and second cooling fluid outlets 352 and 356, the apparatus 102 formed in FIGS. 13A-13I can be fluidly connected to other components of the system 100 to form a complete cryogenically cooled compact-format circuit card 104 environment, either immediately or after the passage of a predetermined period of time.

Figure 14:
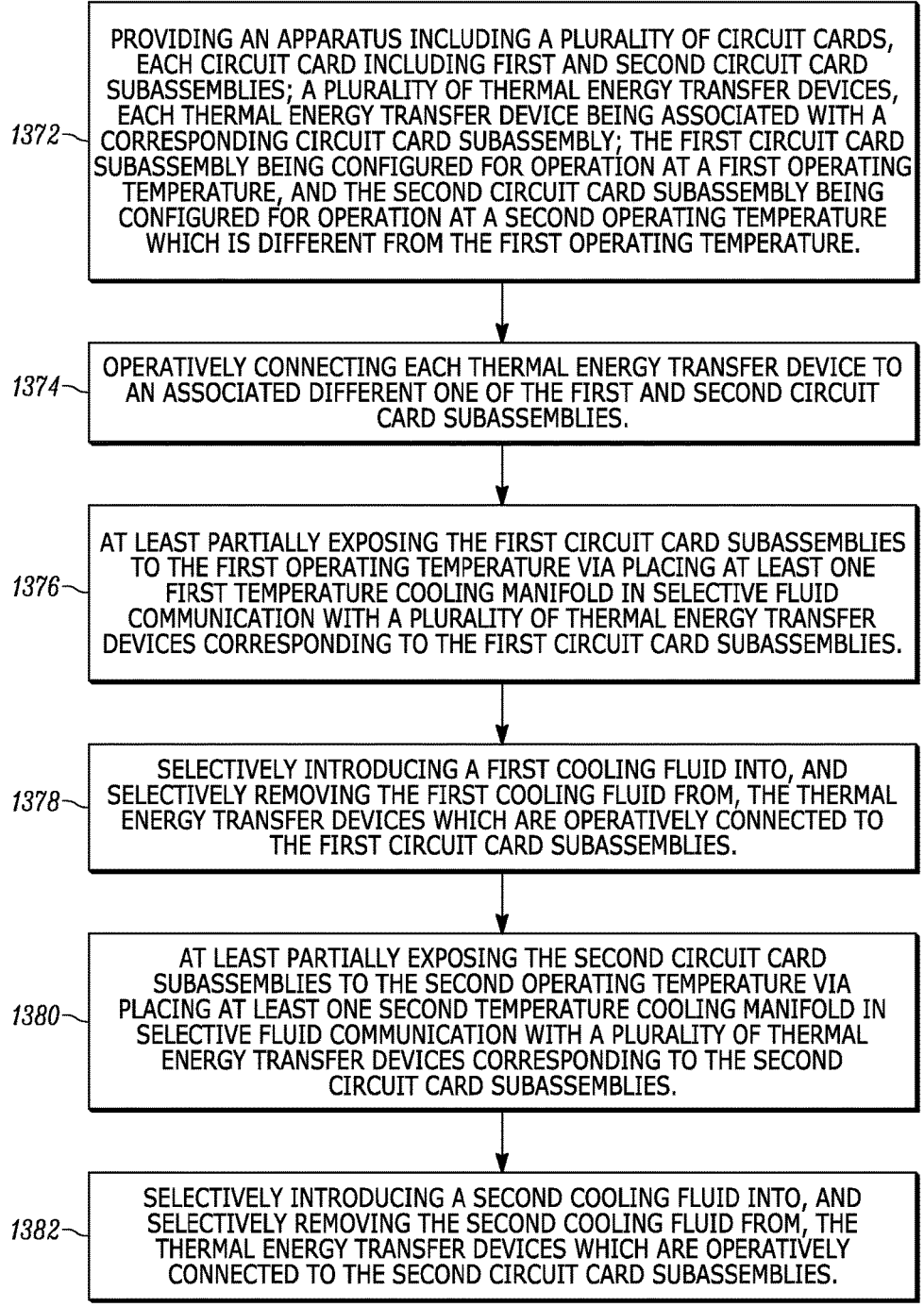
FIG. 14 is a flowchart of an example method of use of the aspect of FIG. 2.

FIG. 14 is a flowchart summarizing an example method of providing immersion cooling in a compact-format circuit card 104 environment using an apparatus 102 and/or a system 100 as previously discussed. In first action block 1372, an apparatus 102 as previously described is provided. At least one apparatus 102, the first and second cooling fluid sources 242 and 246, and the first and second cooling fluid destinations 250 and 254 could be at least partially enclosed within a cabinet 162, and the cabinet 162 mounted within an aircraft, at any desired time relative to performance of the first action block 1472. As previously shown and described, providing the apparatus 102 as in the first action block 1372 could include placing each manifold interface 736 in bidirectional fluid communication with a corresponding thermal energy transfer device 720 via an interface connector 738. Similarly, during the performance of the first action block 1372, each of the plurality of circuit cards 104 could be transversely positioned with respect to an adjacent circuit card 104, with at least one thermal energy transfer device 720 being interposed transversely between each transversely adjoining pair of circuit cards 104. It should also be noted that at least one of the plurality of circuit cards 104 may be supported by the housing 358 via a corresponding suspension joint 1268, such that some degree of relative transverse movement is allowed between the housing 358 and the corresponding circuit card 104.

Regardless of the exact way in which the apparatus 102 is provided in assembled, control moves from first action block 1372 to second action block 1374, wherein each thermal energy transfer device 720 is operatively connected to an associated different one of the first and second circuit card subassemblies 706 and 708.

In the third action block 1376 the first circuit card subassemblies 706 are at least partially exposed to the first operating temperature via placing at least one first temperature cooling manifold 432 in selective fluid communication with a plurality of thermal energy transfer devices 720a corresponding to the first circuit card subassemblies 706. A first cooling fluid is selectively introduced into, and selectively removed from, the thermal energy transfer devices 720 which are operatively connected to the first circuit card subassemblies 706 in fourth action block 1378.

Similarly, in the fifth action block 1380, the second circuit card subassemblies 708 are at least partially exposed to the second operating temperature via placing at least one second temperature cooling manifold 434 in selective fluid communication with a plurality of thermal energy transfer devices 720 corresponding to the second circuit card subassemblies 708. Finally, in sixth action block 1382, a second cooling fluid is selectively introduced into, and selectively removed from, the thermal energy transfer devices 720 which are operatively connected to the second circuit card subassemblies 708.

Steps of the method of FIG. 14 can be carried out before, during, or after assembly of the apparatus 102 into a system 100 and/or use of a system 100 in an aircraft or other compact-format use environment, as previously described. The method of FIG. 14 can also or instead be carried out similarly with a plurality of apparatuses 102 or portions thereof, sequentially or concurrently. One of ordinary skill in the art will be able to configure and operate a system 100 as shown and described herein for a desired use environment.

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature may not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Though cooling is used herein as a temperature control example, one of ordinary skill in the art could providing heating using the apparatus 102 and/or system 100, or substantially similar constructs thereto. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

We claim:

1. An apparatus for providing immersion cooling in a compact-format circuit card environment, the apparatus comprising:
   a plurality of circuit cards, each circuit card including first and second longitudinally spaced circuit card subassemblies, connected together into a single circuit card oriented substantially in a lateral-longitudinal plane, the first and second circuit card subassemblies being connected together by a longitudinally extending card connector, the first and second circuit card subassemblies having first and second operating temperatures, respectively, the first and second operating temperatures being different from one another;

a plurality of thermal energy transfer devices, with each thermal energy transfer device being operatively connected to an area of a corresponding circuit card correlated with a selected one of the first and second circuit card subassemblies, each thermal energy transfer device at least partially inducing the respective one of the first and second operating temperatures to a corresponding circuit card subassembly, each thermal energy transfer device transversely overlying at least a supermajority of the corresponding circuit card subassembly and being longitudinally spaced from an other circuit card subassembly of the corresponding circuit card;

at least one first temperature cooling manifold being in selective fluid communication with at least one thermal energy transfer device at least partially inducing the first operating temperature, the first temperature cooling manifold selectively introducing a first cooling fluid into, and selectively removing the first cooling fluid from, the thermal energy transfer device at least partially inducing the first operating temperature;

at least one second temperature cooling manifold being in selective fluid communication with at least one thermal energy transfer device at least partially inducing the second operating temperature, the second temperature cooling manifold selectively introducing a second cooling fluid into, and selectively removing the second cooling fluid from, the thermal energy transfer device at least partially inducing the second operating temperature;

a plurality of manifold interfaces, with each manifold interface being in fluid communication with a corresponding thermal energy transfer device, each manifold interface for selective fluid communication with a corresponding cooling manifold; and a housing including a first operating fluid inlet in fluid communication via the first temperature cooling manifold with a first operating fluid outlet and a second operating fluid inlet in fluid communication via the second temperature cooling manifold with a second operating fluid outlet, the housing supporting and at least partially surrounding the plurality of circuit cards, the plurality of thermal energy transfer devices, the plurality of manifold interfaces, and the first and second temperature cooling manifolds.

2. The apparatus of claim 1, wherein the thermal energy transfer device associated with a selected circuit card is a first thermal energy transfer device, and including a second thermal energy transfer device operatively connected to an area of the selected circuit card correlated with the other one of the first and second circuit card subassemblies, the second thermal energy transfer device at least partially inducing the respective one of the first and second operating temperatures to the other circuit card subassembly of the selected circuit card, the second thermal energy transfer device transversely overlying at least a supermajority of the other circuit card subassembly and being laterally spaced from the selected circuit card subassembly.

3. The apparatus of claim 1, wherein the thermal energy transfer device is a circulating-coolant heat sink.

4. The apparatus of claim 1, wherein each manifold interface is in bidirectional fluid communication with a corresponding thermal energy transfer device via an interface connector.

5. The apparatus of claim 1, wherein each thermal energy transfer device is in direct thermally conductive contact with at least a portion of the corresponding circuit card subassembly.

6. The apparatus of claim 1, wherein the housing is contained in a vacuum ambient environment.

7. The apparatus of claim 1, wherein each circuit card subassembly includes a plurality of IC chips extending transversely from a single backing substrate, the backing substrate also serving as the card connector.

8. The apparatus of claim 7, wherein the card connector is less thermally conductive than either of the first and second circuit card subassemblies.

9. The apparatus of claim 1, wherein each circuit card subassembly includes a plurality of IC chips extending transversely from a subassembly substrate, and each card connector comprises at least one longitudinally extending flexible interconnect.

10. The apparatus of claim 1, wherein each of the plurality of circuit cards is transversely positioned with respect to an adjacent circuit card, with at least one thermal energy transfer device interposed transversely between each transversely adjoining pair of circuit cards.

11. The apparatus of claim 1, wherein at least one of the plurality of circuit cards is supported by the housing via a corresponding suspension joint to allow relative transverse movement between the housing and the corresponding circuit card.

12. The apparatus of claim 11, wherein the suspension joint pivotally attaches the corresponding circuit card to the housing for relative pivotal movement between the housing and the corresponding circuit card.

13. A method of providing immersion cooling in a compact-format circuit card environment, the method comprising:

providing an apparatus including:
a plurality of circuit cards, each circuit card including first and second circuit card subassemblies, a plurality of thermal energy transfer devices, each thermal energy transfer device being associated with a corresponding circuit card subassembly, the first circuit card subassembly being configured for operation at a first operating temperature, and the second circuit card subassembly being configured for operation at a second operating temperature which is different from the first operating temperature,
at least one first temperature cooling manifold, and
at least one second temperature cooling manifold;

operatively connecting each thermal energy transfer device to an associated different one of the first and second circuit card subassemblies;

at least partially exposing the first circuit card subassemblies to the first operating temperature via placing at least one first temperature cooling manifold in selective fluid communication with a plurality of thermal energy transfer devices corresponding to the first circuit card subassemblies;

selectively introducing a first cooling fluid into, and selectively removing the first cooling fluid from, the thermal energy transfer devices which are operatively connected to the first circuit card subassemblies;

at least partially exposing the second circuit card subassemblies to the second operating temperature via placing at least one second temperature cooling manifold in selective fluid communication with a plurality of thermal energy transfer devices corresponding to the second circuit card subassemblies; and selectively introducing a second cooling fluid into, and selectively removing the second cooling fluid from, the thermal energy transfer devices which are operatively connected to the second circuit card subassemblies.

14. The method of claim 13, including:

providing the apparatus with a plurality of manifold interfaces, with each manifold interface being in fluid communication with a corresponding thermal energy transfer device, each manifold interface for selective fluid communication with a corresponding cooling manifold;

supporting and at least partially surrounding the plurality of circuit cards, the plurality of thermal energy transfer devices, the plurality of manifold interfaces, and the first and second temperature cooling manifolds with a housing including a first operating fluid inlet in fluid communication, via the first temperature cooling manifold, with a first operating fluid outlet and a second operating fluid inlet in fluid communication, via the second temperature cooling manifold, with a second operating fluid outlet;

placing a first cooling fluid source in fluid supplying communication with the first temperature cooling manifold via the first operating fluid inlet;

placing a second cooling fluid source in fluid supplying communication with the second temperature cooling manifold via the second operating fluid inlet;

placing a first cooling fluid destination in fluid removing communication with the first temperature cooling manifold via the first operating fluid outlet; and placing a second cooling fluid destination in fluid removing communication with the second temperature cooling manifold via the second operating fluid outlet.

15. The method of claim 14, including supporting and at least partially enclosing at least one apparatus, the first and second cooling fluid sources, and the first and second cooling fluid destinations within a cabinet; and mounting the cabinet within an aircraft.

16. The method of claim 13, wherein the thermal energy transfer device associated with a selected circuit card is a first thermal energy transfer device associated with a selected one of the first and second circuit card subassemblies, and including:

operatively connecting a second thermal energy transfer device to the other of the first and second circuit card subassemblies; and at least partially inducing the respective one of the first and second operating temperatures to the other circuit card subassembly with the second thermal energy transfer device.

17. The method of claim 13, including placing each manifold interface in bidirectional fluid communication with a corresponding thermal energy transfer device via an interface connector.

18. The method of claim 13, including transversely positioning each of the plurality of circuit cards with respect to an adjacent circuit card; and interposing at least one thermal energy transfer device transversely between each transversely adjoining pair of circuit cards.

19. The method of claim 13, including:

supporting at least one of the plurality of circuit cards by the housing via a corresponding suspension joint; and allowing relative transverse movement between the housing and the corresponding circuit card.

20. A system for providing immersion cooling in a compact-format circuit card environment, the system comprising:

an apparatus comprising a plurality of circuit cards, each circuit card including first and second longitudinally spaced circuit card subassemblies, connected together into a single circuit card oriented substantially in a lateral-longitudinal plane, the first and second circuit card subassemblies being connected together by a longitudinally extending card connector, the first and second circuit card subassemblies having first and second operating temperatures, respectively, the first and second operating temperatures being different from one another, a plurality of thermal energy transfer devices, with each thermal energy transfer device being operatively connected to an area of a corresponding circuit card correlated with a selected one of the first and second circuit card subassemblies, each thermal energy transfer device at least partially inducing the respective one of the first and second operating temperatures to a corresponding circuit card subassembly, each thermal energy transfer device transversely overlying at least a supermajority of the corresponding circuit card subassembly and being longitudinally spaced from an other circuit card subassembly of the corresponding circuit card, at least one first temperature cooling manifold being in selective fluid communication with at least one thermal energy transfer device at least partially inducing the first operating temperature, the first temperature cooling manifold selectively introducing a first cooling fluid into, and selectively removing the first cooling fluid from, the thermal energy transfer device at least partially inducing the first operating temperature, at least one second temperature cooling manifold being in selective fluid communication with at least one thermal energy transfer device at least partially inducing the second operating temperature, the second temperature cooling manifold selectively introducing a second cooling fluid into, and selectively removing the second cooling fluid from, the thermal energy transfer device at least partially inducing the second operating temperature, a plurality of manifold interfaces, with each manifold interface being in fluid communication with a corresponding thermal energy transfer device, each manifold interface for selective fluid communication with a corresponding cooling manifold, and a housing including a first operating fluid inlet in fluid communication via the first temperature cooling manifold with a first operating fluid outlet and a second operating fluid inlet in fluid communication via the second temperature cooling manifold with a second operating fluid outlet, the housing supporting and at least partially surrounding the plurality of circuit cards, the plurality of thermal energy transfer devices, the plurality of manifold interfaces, and the first and second temperature cooling manifolds;

a first cooling fluid source in fluid supplying communication with the first temperature cooling manifold via the first operating fluid inlet;

a second cooling fluid source in fluid supplying communication with the second temperature cooling manifold via the second operating fluid inlet;

a first cooling fluid destination in fluid removing communication with the first temperature cooling manifold via the first operating fluid outlet;

a second cooling fluid destination in fluid removing communication with the second temperature cooling manifold via the second operating fluid outlet; and a cabinet supporting and at least partially enclosing the apparatus, the first and second cooling fluid sources, and the first and second cooling fluid destinations.

\* \* \* \* \*